United States Patent
Lee et al.

(10) Patent No.: US 6,677,200 B2
(45) Date of Patent: Jan. 13, 2004

(54) METHOD OF FORMING NON-VOLATILE MEMORY HAVING FLOATING TRAP TYPE DEVICE

(75) Inventors: Chang-Hyun Lee, Kyunggi-do (KR); Jung-Dal Choi, Kyunggi-do (KR); Sung-Hoi Hur, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/194,182

(22) Filed: Jul. 12, 2002

(65) Prior Publication Data

US 2003/0032242 A1 Feb. 13, 2003

(30) Foreign Application Priority Data

Aug. 9, 2001 (KR) .......................... 2001-47945

(51) Int. Cl.[7] ........................................... H01L 21/3366
(52) U.S. Cl. ..................................... 438/257; 438/954
(58) Field of Search .................... 438/257, 258, 438/266, 635, 695, 680, 681, 770, 954

(56) References Cited

U.S. PATENT DOCUMENTS

| | | | | | |
|---|---|---|---|---|---|
| 5,515,319 A | * | 5/1996 | Smayling et al. | ...... | 365/185.27 |
| 5,674,762 A | * | 10/1997 | See et al. | .................. | 438/257 |
| 6,058,045 A | * | 5/2000 | Pourkeramati | ......... | 365/185.17 |
| 6,157,058 A | * | 12/2000 | Ogura | ........................ | 257/315 |

OTHER PUBLICATIONS

H. Reisinger, et al. "A Novel SONOS Structure for Non-volatile Memories with Improved Data Retention" 1997 Symposium on VLSI Technology Digest of Technical Papers.

* cited by examiner

*Primary Examiner*—David Nhu
(74) *Attorney, Agent, or Firm*—Marger Johnson & McCollom, P.C.

(57) ABSTRACT

A method of forming a non-volatile memory having a floating trap-type device is disclosed in the present invention. In the method, a relatively thick thermal oxide layer is formed at a semiconductor substrate and patterned to leave a thick thermal oxide pattern at a high-voltage region (a high-voltage region defining step). An oxide-nitride-oxide (ONO) layer is formed over substantially the entire surface (the substantial surface) of the semiconductor substrate and patterned to leave an ONO pattern at a cell memory region (a cell memory region defining step). After the high-voltage region defining step and the cell memory region defining step, a thermal oxidizing process is performed with respect to the semiconductor substrate where a low-voltage region is exposed, thereby forming a relatively thin gate insulation layer for a low-voltage type device (a low-voltage region defining region).

11 Claims, 6 Drawing Sheets

METHOD OF FORMING NON-VOLATILE MEMORY HAVING FLOATING TRAP TYPE DEVICE

RELATED APPLICATION

This application relies for priority upon Korean Patent Application No. 2001-47945, filed on Aug. 9, 2001, the contents of which are herein incorporated by this reference in their entirety.

FIELD OF THE INVENTION

The present invention relates to a method of forming a non-volatile memory device. More particularly, the present invention relates to a method of forming a non-volatile memory having a floating trap-type device.

BACKGROUND OF THE INVENTION

A non-volatile memory device needs a high voltage for writing and erasing data in a memory transistor and a specific reliable storage place for retaining data. Because of this, the structure of a non-volatile memory device and the process of forming the same can be complicated.

Non-volatile memory devices can be classified into a floating gate-type device and a floating trap-type device, according to the structure. The floating trap-type device is programmed by using a method of storing electrons in a trap formed in a non-conductive electron storage layer between a gate electrode and a semiconductor substrate. In order to form a floating trap, a tunneling insulation layer and a blocking insulation layer are formed on and under a silicon nitride layer that acts as a charge storage layer.

Figure 1:
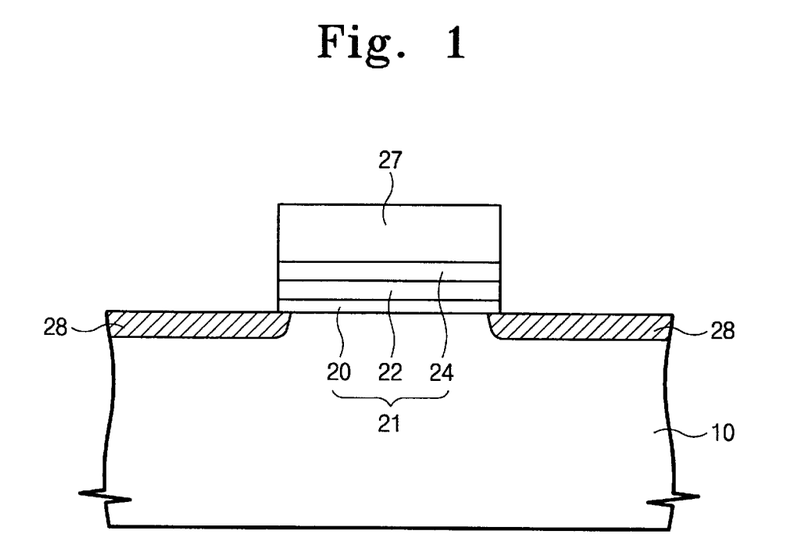
FIG. 1 is a cross-sectional view showing a conventional structure of a floating trap-type unit device.

FIG. 1 illustrates a cross-sectional view of a typical silicon oxide nitride oxide semiconductor (SONOS) structure in a floating trap-type memory device. Referring to FIG. 1, in a memory transistor device cell, a tunneling insulation layer 20, a charge storage layer 22, a blocking insulation layer 24 and a gate electrode 27 are sequentially stacked on an active region of a semiconductor substrate 10 to form a gate pattern. Impurity diffusion layers 28 are formed in active regions on both sides of the gate pattern. Conventionally, the tunneling insulation layer 20 is formed of thermal oxide, and the charge storage layer 22 is formed of silicon nitride.

In a non-volatile semiconductor memory device of the floating gate type, the gate insulation layer is conventionally formed with the same thickness concurrently with formation of another gate insulation layer in a low-voltage transistor of a peripheral circuit. However, the tunneling insulation layer of a floating trap-type memory device conventionally has a different thickness from the gate insulation layer for a low-voltage transistor of a peripheral circuit. Thus, a process of fabricating a non-volatile semiconductor device with a floating trap-type memory device tends to be more complicated than the process fabricating of a non-volatile semiconductor device with a floating gate-type memory device.

SUMMARY OF THE INVENTION

It is an object of the present invention to simplify the process of forming a non-volatile memory having a floating trap-type device.

It is another object of the present invention to provide a simpler process of forming a non-volatile memory having a floating trap-type device that increases data retention reliablity.

The present invention is directed to a method of forming a non-volatile semiconductor memory device. The method includes three basic steps. A relatively thick thermal oxide layer is formed at a semiconductor substrate and patterned to leave a thick thermal oxide pattern at a high-voltage region (hereinafter, the high-voltage region defining step). An oxide-nitride-oxide (ONO) layer is formed over the entire surface of the semiconductor substrate and is patterned to leave an ONO pattern in a cell memory region (hereinafter, the cell memory region defining step). A thermal oxidizing process is performed with respect to a semiconductor substrate where a low-voltage region is exposed, thereby forming a relatively thin gate insulation layer for a device (hereinafter, the low-voltage region defining step).

In the present invention, the high-voltage region defining step can be performed after or before the cell memory region defining step.

In the cell memory region defining step of the present invention, after forming the ONO layer at the entire surface of the semiconductor substrate and forming the etch mask pattern to cover the cell memory region, an upper oxide layer and a nitride layer of the ONO layer are selectively removed by using patterned etch mask in a region excluding the cell memory region. At this time, the etch mask can be used for selectively etching the upper oxide layer of the ONO layer, or the upper oxide layer and the nitride layer of the ONO layer, or the entire ONO layer, and then the etch mask is removed. Especially, if the etch mask is used for selectively etching only the upper oxide layer and then removed, the resultant upper oxide pattern can be used as an etch mask for selectively etching the nitride layer of the ONO layer. And, after forming an additional patterned etch mask to cover the cell memory region, by using the additional etch mask pattern to cover the cell memory region, the lower oxide layer of the ONO layer can be etched.

In the low-voltage region defining step of the present invention, when the ONO layer of the low-voltage region is completely removed, or when a lower oxide layer of the ONO layer is still present, the thermal oxidizing process can be performed with respect to the semiconductor substrate in the low-voltage region.

However, if the cell memory region defining step is performed before the high-voltage region defining step, in the cell memory region defining step, after forming the ONO layer at the semiconductor substrate, a conductive layer, and a protective layer of silicon nitride for an oxygen barrier are formed and patterned while patterning the ONO layer. Then, when a thick thermal oxide layer is formed in a subsequent high-voltage region defining step, the protective layer can prevent oxidation of the conductive layer. The protective layer is removed from the conductive layer in such a manner that a thick gate insulation layer, a thin gate insulation layer, and an ONO layer covered by a conductive layer are formed at the high-voltage region, the low-voltage region, and the cell memory region, respectively. A conductive layer is then stacked over the entire surface of the semiconductor substrate to form a gate pattern.

DESCRIPTION OF THE PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Embodiment 1

Figure 2:
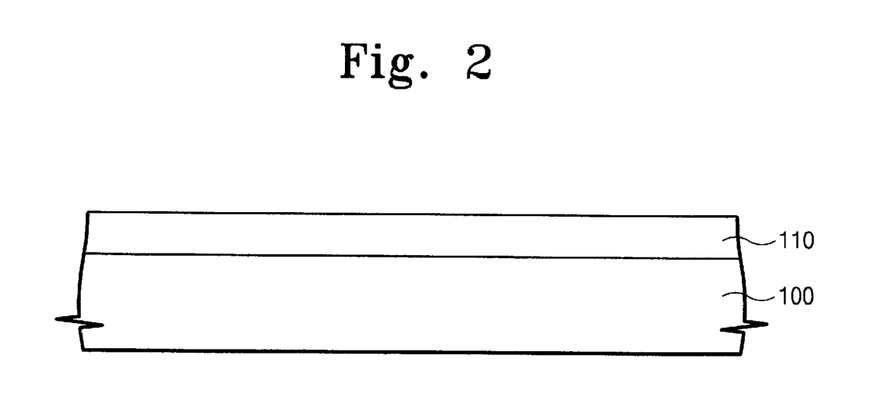
FIGS. 2 through 6 are cross-sectional views showing a process according to a first embodiment of the present invention.

Referring to FIG. 2, a thick silicon oxide layer 110 is formed over substantially the entire surface (the substantial surface) of a semiconductor substrate 100. An isolation layer is conventionally formed on the semiconductor substrate, but is not illustrated in the drawings. The thick silicon oxide layer 110 has a thickness that enables it to endure the high voltage required for a memory device operation.

Figure 3:
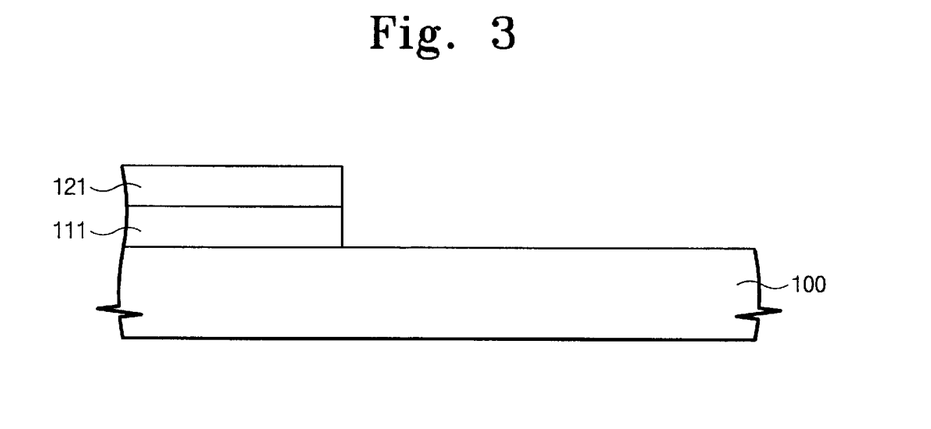

Referring to FIG. 3, the thick silicon oxide layer 110 is patterned to leave a thick silicon oxide pattern 111 only at a high-voltage region of the memory device. As in the conventional patterning process, the patterning process includes coating a photoresist layer, exposing by using a photomask, developing to form a first photoresist pattern 121, and etching the thick silicon oxide layer 110 by using the first photoresist pattern 121 as an etch mask.

Figure 4:
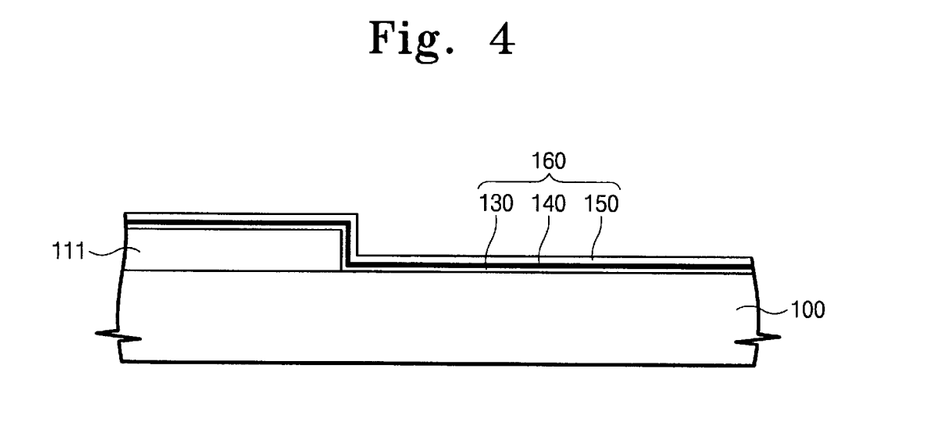

Referring to FIG. 4, the first photoresist pattern 121 is removed by using an ashing or wet stripping technique, and an ONO layer 160 is formed over substantially the entire surface (the substantial surface) of the semiconductor substrate. A lower oxide layer 130 of the ONO layer 160 can be formed by using a CVD or a thermal oxidizing technique. A silicon nitride layer 140 of the ONO layer 160 may be formed conventionally by CVD, but alternatively may be formed by a thermal nitrifying process with respect to an oxide surface. An upper oxide layer 150 of the ONO layer 160 is conventionally formed by the CVD technique.

Figure 5:
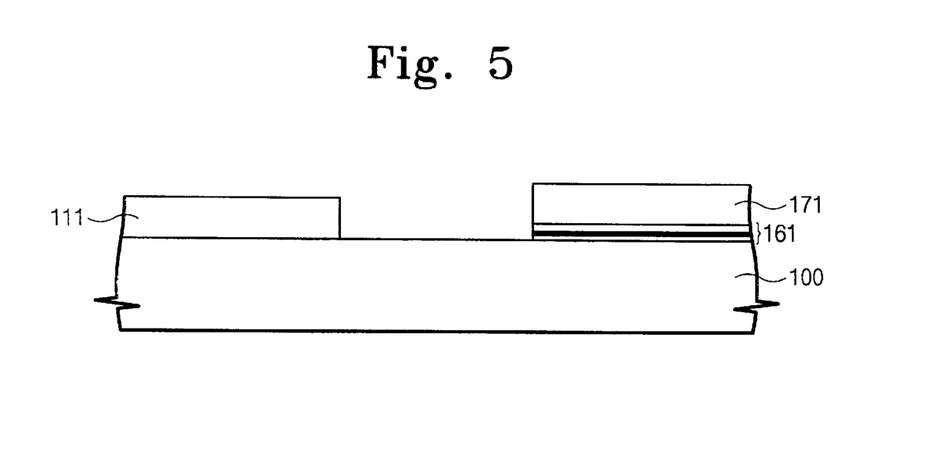

Referring to FIG. 5, the ONO layer 160 is patterned. A second photoresist pattern 171 is first formed to cover a cell memory region, and by using this as an etch mask, the ONO layer 160 is removed at a region excluding the cell memory region, to form an ONO pattern 161. The ONO layer 160 is etched by an anisotropical dry-etch, but alternatively it may be etched by an isotropic wet-etch. The lower oxide layer 130 and the nitride layer 140 of the ONO layer 160 are preferably removed by using different etchants or different etching conditions. When the lower oxide layer 130 is etched, the thick oxide pattern 111 of the high-voltage region can be partially etched.

Figure 6:
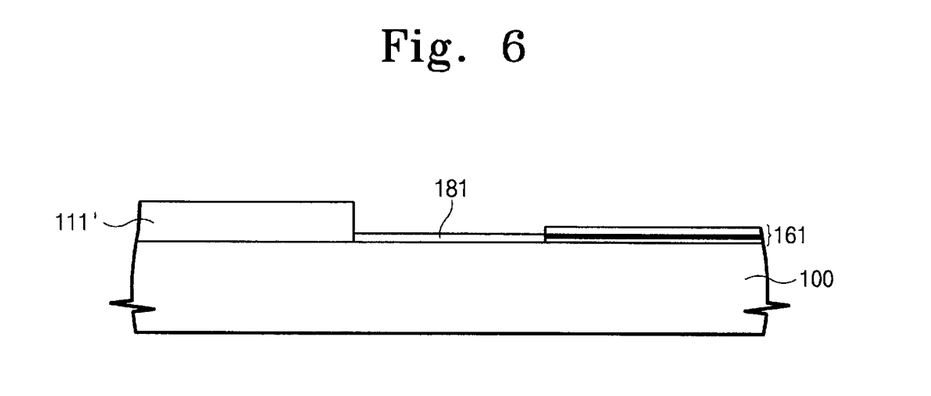

Referring to FIG. 6, the second photoresist pattern 171 is removed. Then, a thermal oxidizing process is performed with respect to substantially the entire surface (the substantial surface) of the semiconductor substrate. Thus, a thin thermal oxide layer 181 is formed at a low-voltage region where the silicon substrate is exposed. Additionally, at the high-voltage region, an upper part of the semiconductor substrate is oxidized, and this is added to the existing thick thermal oxide pattern 111 to form a thicker thermal oxide pattern 111'. The thermal oxide layer 181 of the low-voltage region is formed with a thin thickness for smooth tunneling. At the cell memory region, the nitride layer 140 in the ONO pattern 161 cuts off diffusion of oxygen to inhibit growth of the thermal oxide layer.

Embodiment 2

Figure 7:
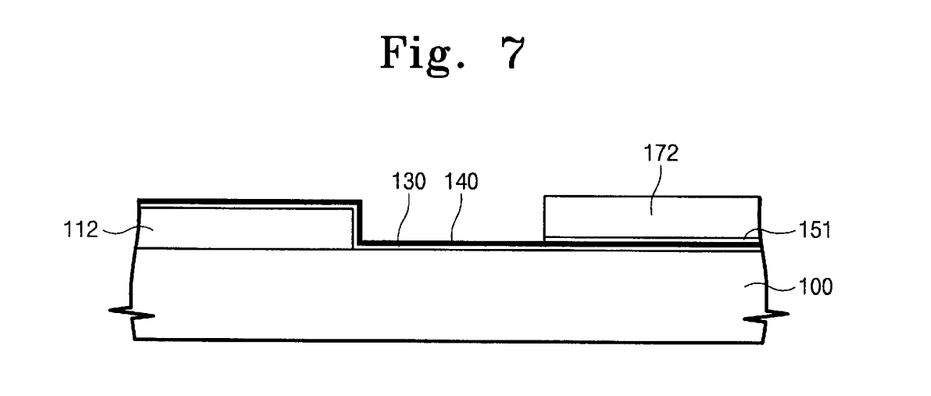
FIGS. 7 through 9 are cross-sectional views showing several aspects different from the first embodiment according to a second embodiment of the present invention.
Figure 8:
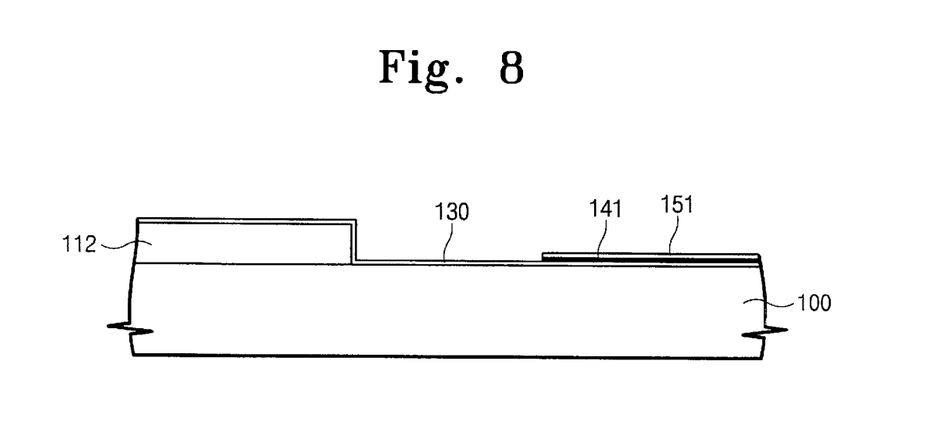

The second embodiment has the same process steps with respect to FIGS. 2 through 4 of the first embodiment. In FIGS. 7 and 8, a thick silicon oxide pattern 112 corresponds to a thick silicon oxide pattern 111 appearing in FIGS. 3, 4, and 5.

Referring to FIG. 7, an upper oxide layer 150 of an ONO layer is patterned to form an upper oxide pattern 151. A third photoresist pattern 172 is formed to cover a cell memory region, and by using this as an etch mask, an upper oxide layer at a region excluding the cell memory region is selectively etched and removed. At this time, the upper silicon nitride layer 140 of the ONO layer can be used as an etch stopping layer.

Referring to FIG. 8, the third photoresist pattern 172 is removed. By using the upper oxide pattern 151 of the cell memory region as an etch mask, the silicon nitride layer 140 of the ONO layer is selectively etched, thereby forming a silicon nitride pattern 141 that covers the cell memory region.

Figure 9:
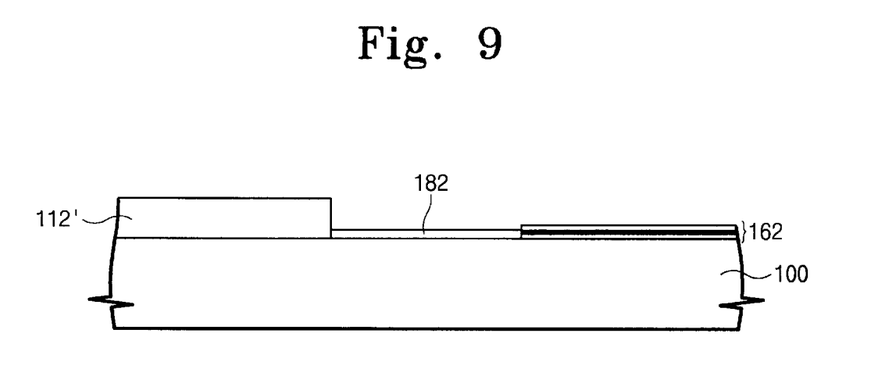

Referring to FIG. 9, the lower oxide layer 130 of the ONO layer, exposed at a region excluding the cell memory region, is etched, thereby exposing the silicon substrate at the low-voltage region. At this time, an ONO pattern 162 is formed at the cell memory region. The upper oxide pattern 151 of the ONO pattern 162 can be partially removed to thin it, and a thick thermal oxide pattern 112' at the high-voltage region can be partially etched. Thus, the upper oxide layer of the ONO layer is preferably formed thicker than a finally required thickness by considering the lower oxide layer 130. Then, a thermal oxidizing process is performed with respect to substantially the entire surface (the substantial surface) of the semiconductor substrate. Thus, a thin thermal oxide layer 182 suitable as a tunneling layer is formed in a low-voltage region where the silicon substrate is exposed.

As another explanation with respect to FIG. 9, a thermal oxidizing process is performed in such a manner that the lower oxide layer 130 of the ONO layer is left at the low-voltage region, and thus, a thin thermal oxide layer 182 is formed from a thick silicon oxide layer at the low-voltage region. In this case, the lower oxide layer 130 of the ONO layer is sufficiently thin and preferably formed of a thermal oxide.

Embodiment 3

Figure 10:
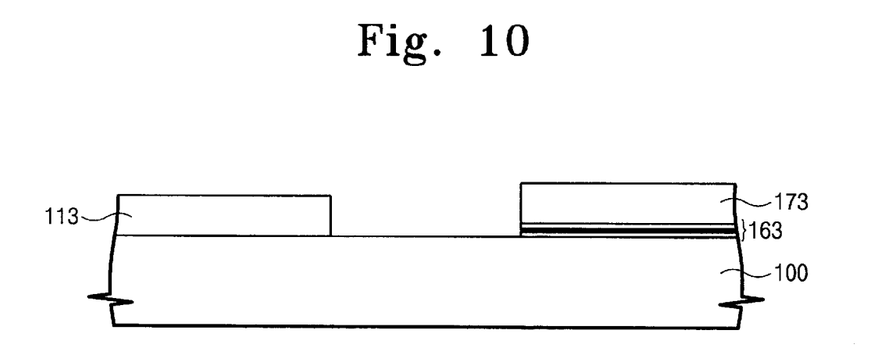
FIGS. 10 through 11 are cross-sectional views showing several steps according to a third embodiment of the present invention.

Referring to FIG. 10, a fourth photoresist pattern 173 is formed to cover a cell memory region after the steps up to and including those illustrated in FIG. 8 of the second embodiment. By using the fourth photoresist pattern 173 as an etch mask, the lower oxide layer 130 of the ONO layer that is exposed at a region excluding the cell memory region is etched. Thus, an ONO pattern 163 remains. When the lower oxide layer 130 is etched, a thick thermal oxide pattern 113 at the high-voltage region is partially etched. The silicon substrate is exposed at the low-voltage region.

Figure 11:
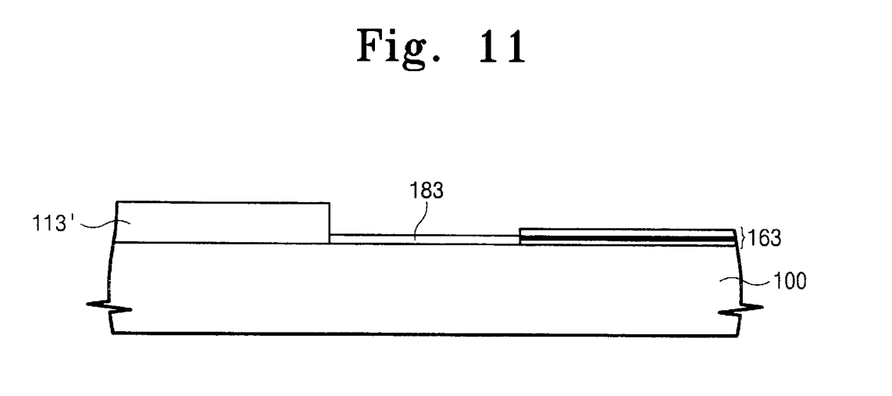

Referring to FIG. 11, the fourth photoresist pattern 173 is removed. A thermal oxidizing process is performed with respect to substantially the entire surface (the substantial surface) of the semiconductor substrate. Thus, a thicker thermal oxide pattern 113' is formed in the high-voltage region and a thin thermal oxide layer 183 suitable for tunneling is formed at the low-voltage region where the semiconductor substrate is exposed.

Embodiment 4

Figure 12:
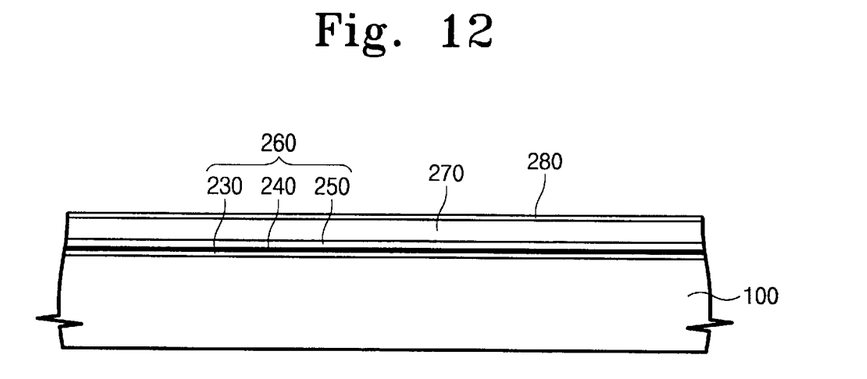
FIGS. 12 through 17 are cross-sectional views showing several steps according to a fourth embodiment of the present invention.

Referring to FIG. 12, an ONO layer 260, which will form a floating trap, is formed over substantially the entire surface (the substantial surface) of a semiconductor substrate 100. The ONO layer 260 comprises a lower oxide layer 230, a silicon nitride layer 240, and an upper oxide layer 250. The lower oxide layer 230, the silicon nitride layer 240, and the upper oxide layer 250 are representative layers functioning as a tunneling insulation layer, a charge storage layer having an electron trap, and a blocking insulation layer, respectively, and can be replaced by other layers which have these same functions. Then, a conductive layer 270 is formed of a polysilicon and a protective layer 280 functioning as an oxygen barrier is formed of a silicon nitride.

In a general SONOS device, if a gate electrode material is formed of a polysilicon doped by P-type impurities, the electron retention characteristic and the erase speed of a device are increased. See, for example 1997 Symposium on VLSI Technology Digest of Technical Paper at 113, "A Novel SONOS Structure for Nonvolatile Memories with Improved Data Retention". Thus, the polysilicon stacked on the ONO layer is preferably doped by P-type impurities.

Figure 13:
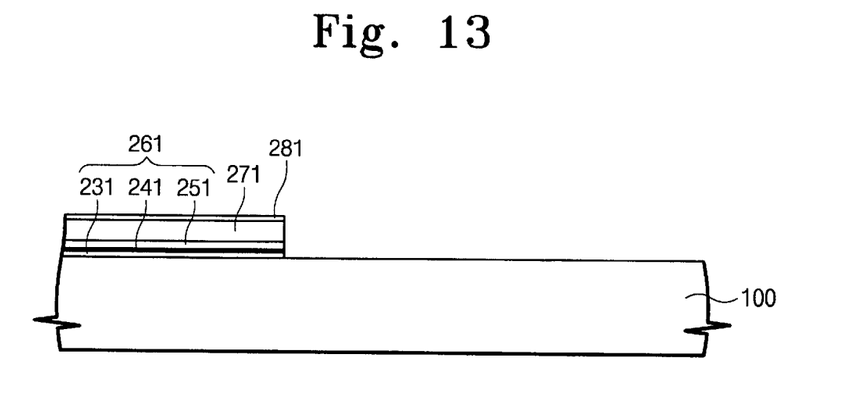

Referring to FIG. 13, the protective layer 280, the conductive layer 270, and the ONO layer 260 are patterned to form complete patterns composed of a protective pattern 281, a conductive pattern 271, and an ONO pattern 261, only in the cell memory region. Like a conventional patterning process, the patterning process includes coating a photoresist layer, exposing by using a photomask, developing to form a fifth photoresist pattern (not illustrated), and etching by using the fifth photoresist pattern as an etch mask. The silicon substrate 100 is exposed at the high-voltage region and the low-voltage region. After the patterning process, the fifth photoresist pattern is removed through an ashing and a wet stripping technique.

Figure 14:
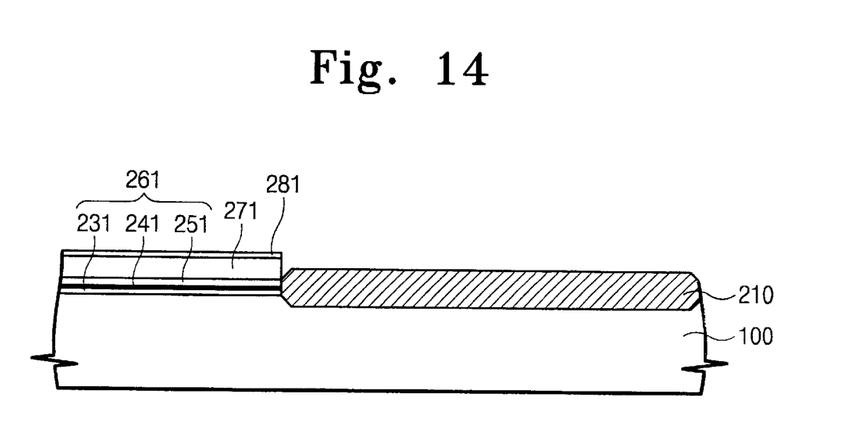

Referring to FIG. 14, by thermally oxidizing the semiconductor substrate 100, a thick thermal oxide layer 210 suitable for a gate insulation layer of a high-voltage region is formed at the high-voltage region and the low-voltage region. A partial bird's beak can occur in the cell memory region. Since the cell memory region is covered by a protective pattern 281 composed of a silicon nitride, the conductive pattern 271 is not oxidized except for an edge part thereof.

Figure 15:
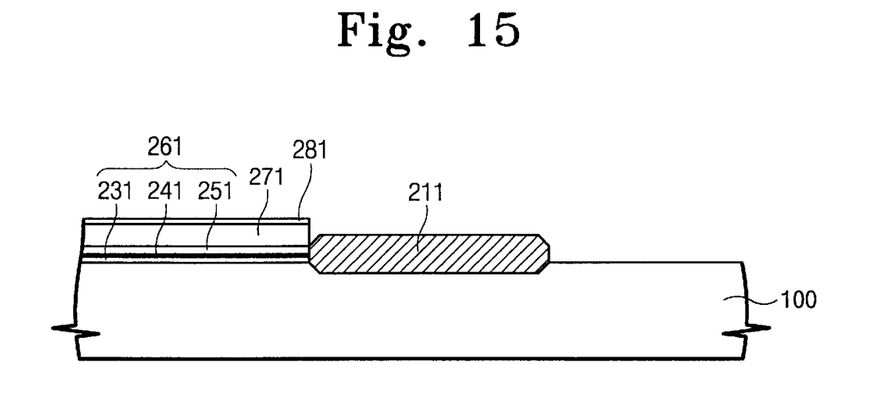

Referring to FIG. 15, a sixth photoresist pattern (not shown) is formed, and the thick thermal oxide layer 210 is etched to form a thick thermal oxide pattern 211. The sixth photoresist pattern exposes at least the low-voltage region and covers the high-voltage region. Being covered by a protective layer 281 of a silicon nitride, the cell memory region can be protected without a photoresist pattern from an etching process. Thus, the silicon substrate 100 is exposed at the low-voltage region. The sixth photoresist pattern is removed.

Figure 16:
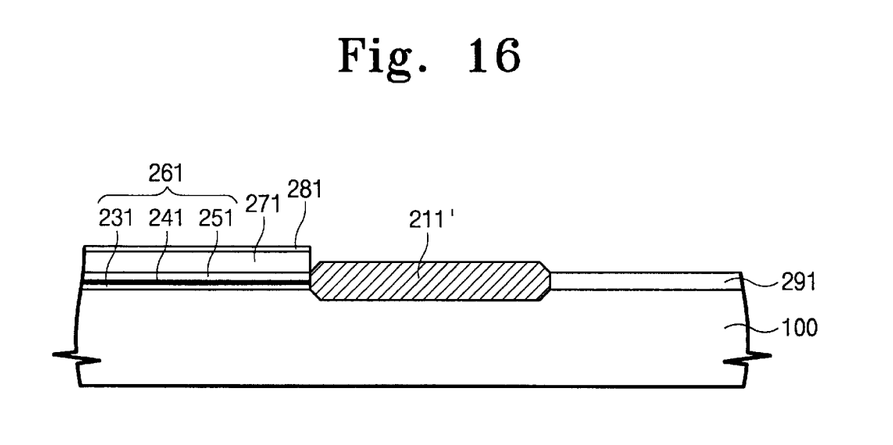

Referring to FIG. 16, a thermal oxidizing process is performed with respect to substantially the entire surface (the substantial surface) of the semiconductor substrate. Thus, a thin thermal oxide layer 291 is newly formed at the low-voltage region. At the high-voltage region, an upper part of the semiconductor substrate is additionally oxidized, which adds to the existing thick thermal oxide pattern 211 to form a thicker thermal oxide pattern 211'. A thermal oxide layer 291 of the low-voltage region is formed with a thin thickness for smooth tunneling. At the cell memory region, the protective pattern 281 and the nitride layer of the ONO layer pattern 261 cut off diffusion of oxygen to prevent thermal oxidizing of the semiconductor substrate and the conductive pattern 271.

Figure 17:
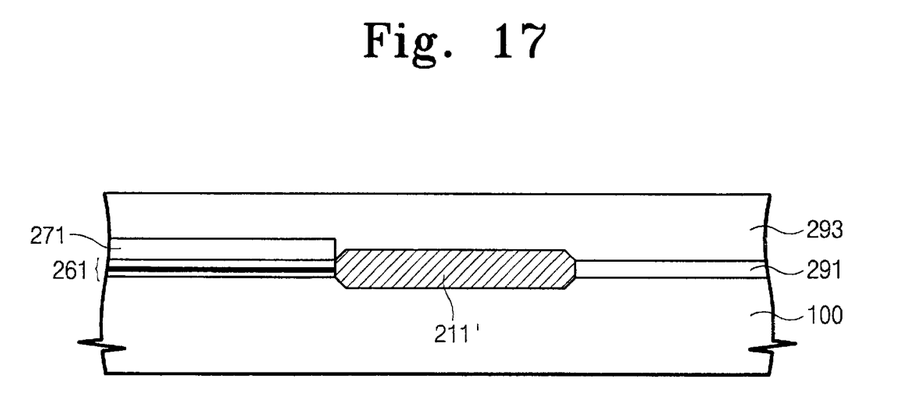

Referring to FIG. 17, a wet-etch process is performed by using a phosphoric acid to remove the protective pattern 281 of the cell memory region. A polysilicon layer is stacked as a conductive layer 293 over the entire surface of the semiconductor substrate. If a transistor with an N-type impurity gate is required for a high-voltage region or a low-voltage region, another polysilicon layer heavily doped by N-type impurities is stacked. Then, through a patterning process, gate patterns are formed at each region. In this case, at the cell memory region, a P-N junction is formed between a gate pattern and a lower layer or an upper layer of the gate pattern, and this can act as a resistance factor. But, if the thickness of a depletion area around the junction area is reduced by making a doping concentration high, and thus, if the junction area becomes a potential barrier to tunneling, then an interlayer resistance in the gate electrode can be minimized and charges can easily flow. Consequently, a gate pattern doped by P-type impurities is formed at a cell memory region and another gate pattern doped by N-type impurities is formed at a peripheral circuit region.

According to the fourth embodiment, in most situations when a polysilicon doped by P-type impurities is required for a gate electrode for a SONOS device and an NMOS-type transistor device is required at a peripheral circuit region, gate polysilicon layers having different impurity types according to regions can be formed without any additional photolithography process steps.

According to the present invention, in fabricating a nonvolatile memory with a floating trap-type device, the fabricating process can be simplified and the devices reliability of data retention can be increased, without an additional exposing process step.

Although the preferred embodiments of the present invention have been described, it is understood that the present invention should not be limited to these preferred embodiments but various changes and modifications can be made by one skilled in the art within the spirit and scope of the present invention as hereinafter claimed.

What is claimed is:

1. A method of forming a non-volatile memory having a floating trap-type device, the method comprising:

a high-voltage region defining step for forming a relatively thick thermal oxide layer at a semiconductor substrate and patterning the formed thermal oxide layer to leave a thick thermal oxide pattern in a high-voltage region;

a cell memory region defining step for forming an oxide-nitride-oxide (ONO) layer over a substantial surface of the semiconductor substrate and patterning the ONO layer to leave an ONO pattern at a cell memory region; and a low-voltage region defining step for thermally oxidizing the semiconductor substrate in a low-voltage region to form a relatively thin gate insulation layer for a low-voltage type device, said low-voltage defining step being performed after the high-voltage region defining step and after the cell memory region defining step.

2. The method as claimed in claim 1, wherein the high-voltage region defining step is performed before the cell memory region defining step.

3. The method as claimed in claim 2, wherein the cell memory region defining step comprises:

forming an ONO layer over the substantial surface of the semiconductor substrate;

forming an etch mask pattern to cover the cell memory region; and selectively removing an upper oxide layer and a nitride layer of the ONO layer by using the etch mask pattern.

4. The method as claimed in claim 2, wherein the cell memory region defining step comprises:

forming an ONO layer over the substantial surface of the semiconductor substrate;

forming an etch mask pattern to cover the cell memory region;

selectively removing an upper oxide layer of the ONO layer by using the etch mask pattern to form an upper oxide pattern; and removing the etch mask pattern and using the upper oxide pattern as an etch mask to remove a nitride layer of the ONO layer.

5. The method as claimed in claim 4, further comprising forming an additional etch mask pattern to cover the cell memory region and selectively removing a lower oxide layer of the ONO layer.

6. The method as claimed in claim 2, wherein the cell memory region defining step comprises:

forming an ONO layer over the substantial surface of the semiconductor substrate;

forming an etch mask pattern to cover the cell memory region; and selectively removing the ONO layer by using the etch mask pattern.

7. The method as claimed in claim 1, wherein the low-voltage region defining step is performed when at least a part of a lower oxide layer of the ONO layer is exposed in the low-voltage region.

8. The method as claimed in claim 1, wherein the cell memory region defining step is performed before the high-voltage region defining step.

9. The method as claimed in claim 8, wherein the cell memory region defining step comprises:

stacking a conductive layer and a silicon nitride layer after forming the ONO layer at the semiconductor substrate; and patterning the stacked conductive layer and the silicon nitride layer while patterning the ONO layer.

10. The method as claimed in claim 9, after the low-voltage region defining step, further comprising:

removing the silicon nitride layer from the low-voltage region; and stacking an additional conductive layer over the substantial surface of the semiconductor substrate.

11. The method as claimed in claim 10, wherein the conductive layer is formed of polysilicon doped by P-type impurities and the additional conductive layer is formed of polysilicon doped by N-type impurities.

* * * * *

UNITED STATES PATENT AND TRADEMARK OFFICE
CERTIFICATE OF CORRECTION

PATENT NO. : 6,677,200 B2
DATED : January 13, 2004
INVENTOR(S) : Lee et al.

It is certified that error appears in the above-identified patent and that said Letters Patent is hereby corrected as shown below:

Drawings,
Sheet 1 of 6, "Fig. 1" should read -- Fig. 1 (Prior Art) --.

Column 4,
Line 59, "silicon substrate is" should read -- silicon substrate 10 is --.

Signed and Sealed this

Twenty-ninth Day of June, 2004

JON W. DUDAS
*Acting Director of the United States Patent and Trademark Office*